(12) United States Patent
Fischer et al.

(10) Patent No.: US 6,410,951 B2
(45) Date of Patent: Jun. 25, 2002

(54) STRUCTURE FOR IMPROVING STATIC REFRESH

(75) Inventors: Mark Fischer; Charles H. Dennison; Fawad Ahmed; Richard H. Lane; John K. Zahurak; Kunal R. Parekh, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/822,249

(22) Filed: Apr. 2, 2001

Related U.S. Application Data

(62) Division of application No. 09/532,094, filed on Mar. 21, 2000.

(51) Int. Cl.$^7$ .............................................. H01L 21/336
(52) U.S. Cl. ...................... 257/280; 257/281; 257/282; 438/302; 438/303
(58) Field of Search ................................ 257/280–283, 257/472–473, 485, 486; 438/302–306, 199, 200

(56) References Cited

U.S. PATENT DOCUMENTS

| | | |
|---|---|---|
| 4,366,613 A | 1/1983 | Ogura et al. |
| 5,376,566 A | 12/1994 | Gonzalez |
| 5,439,835 A | 8/1995 | Gonzalez |
| 5,534,449 A | 7/1996 | Dennison et al. |
| 5,719,424 A | 2/1998 | Ahmad et al. |
| 5,747,855 A | 5/1998 | Dennison et al. |
| 5,998,274 A | * 12/1999 | Akram et al. ................ 438/306 |
| 6,078,071 A | * 6/2000 | Matsuda ...................... 257/280 |
| 6,291,280 B1 | * 9/2001 | Rhodes ........................ 438/199 |

* cited by examiner

Primary Examiner—David Nelms
Assistant Examiner—Dung A Le
(74) Attorney, Agent, or Firm—Dickstein Shapiro Morin & Oshinsky, LLP

(57) ABSTRACT

A double blanket ion implant method for forming diffusion regions in memory array devices, such as a MOSFET access device is disclosed. The method provides a semiconductor substrate with a gate structure formed on its surface. Next, a first pair of diffusion regions are formed in a region adjacent to the channel region by a first blanket ion implantation process. The first blanket ion implantation process has a first energy level and dose. The device is subjected to oxidizing conditions, which form oxidized sidewalls on the gate structure. A second blanket ion implantation process is conducted at the same location as the first ion implantation process adding additional dopant to the diffusion regions. The second blanket ion implantation process has a second energy level and dose. The resultant diffusion regions provide the device with improved static refresh performance over prior art devices. In addition, the first and second energy levels and doses are substantially lower than an energy level and dose used in a prior art single implantation process.

4 Claims, 11 Drawing Sheets

STRUCTURE FOR IMPROVING STATIC REFRESH

This application is a divisional of application Ser. No. 09/532,094, filed on Mar. 21, 2000, which is hereby incorporated by reference.

BACKGROUND OF THE INVENTION

1. Field of the Invention

The present invention relates to the field of semiconductor memory devices and, more particularly to a structure having improved static refresh properties in dynamic random access memory devices and a method of making it.

2. Description of the Related Art

Metal oxide semiconductor (MOS) structures are basic electronic devices used in many integrated circuits. One such structure is the metal oxide semiconductor field effect transistor (MOSFET), which is typically formed in a semiconductor substrate by providing a gate structure over the substrate to define a channel region, and by forming source and drain regions on opposing sides of the channel region.

To keep pace with the current trend toward maximizing the number of circuit devices contained in a single chip, integrated circuit designers continue to design integrated circuit devices with smaller and smaller feature sizes. For example, not too long ago it was not uncommon to have MOSFET devices (including CMOS devices) having channel lengths of 2 microns or more. The current state of the art for production MOSFET devices includes channel lengths of less than a ¼ micron.

As the channel lengths of MOSFET devices have been reduced, MOSFETS have become more susceptible to certain problems. One common problem is increased junction leakage, a condition affecting the refresh characteristics of a dynamic random access memory (DRAM) memory cell. DRAM is a specific category of random access memory (RAM) containing an array of individual memory cells, where each cell includes a capacitor for holding a charge and a transistor for accessing the charge held in the capacitor. Due to junction leakage, the stored charge must be re-stored in the capacitor on a periodic basis through a process known as refresh. Increased junction leakage leads to a premature depletion of the capacitor's stored charge, necessitating more frequent refresh cycles. Because resources are expended in refreshing the DRAM cells, the longer the period between refresh cycles, the better. The term "pause" is often used to represent the amount of time that a DRAM cell, or group of cells, can maintain their charge without undergoing a refresh operation. That is, how long can the DRAM control circuitry pause between refresh operations and still maintain the stored state of the DRAM memory cell. It is desirable to extend the pause period of, and improve the static refresh of, the DRAM.

A manufacturer may want to improve static refresh performance of the DRAM to provide customers with the capability to perform more memory operations (e.g., reads and writes) between refresh cycles. This reduces the overhead required to utilize the DRAM. Moreover, a manufacturer may want to improve static refresh performance to improve the operating specifications of the DRAM. For example, DRAMs typically have a low-power or standby specification requiring the DRAM to operate within a maximum current during a low-power mode. Since memory cells must be refreshed during the lower-power mode, reducing the frequency of the refresh operations will improve the DRAM's operational performance for the low-power mode.

FIG. 1 illustrates a prior art MOSFET memory array device 5. The device 5 and its fabrication method are described in U.S. Pat. No. 5,534,449 (Dennison et al.), which is hereby incorporated by reference in its entirety. Briefly, the fabrication of the device 5 is initiated by forming a gate structure 10 on a substrate 8. The substrate 8 is typically a bulk silicon substrate, which may have a doped well therein in which transistors are formed. The gate structure 10 (referred to in the '449 patent as a gate line) typically comprises a gate oxide 12, a conductive polysilicon layer 14, an overlying $WSi_x$ layer 16, an overlying novellus oxide layer 18 and a $Si_3N_4$ capping layer 20. The cross sectional width of this prior art gate structure 10 is 0.40 microns.

Once the gate structure 10 is formed, the device 5 is subjected to oxidizing conditions. This process step is often referred to as a "re-ox" step or a thermal re-ox step. Oxidized sidewalls 22, 24 are formed on the gate structure 10, and oxide regions 26, 28 are formed on the substrate, as a result of the re-ox step. Subsequent to the re-ox step, a blanket phosphorous implant step is performed to form diffusion regions 30, 32. This blanket phosphorous implant is performed at an energy level ranging from 30 Kev to 60 Kev with a dose ranging from $7 \times 10^{12}$ ions/cm$^2$ to $1.5 \times 10^{13}$ ions/cm$^2$ to provide an average dopant concentration for the diffusion regions 30, 32 ranging from $1 \times 10^{17}$ ions/cm$^3$ to $1 \times 10^{19}$ ions/cm$^3$. For the prior art device 5, this blanket phosphorous implant step is performed after the re-ox step to prevent the phosphorous from diffusing too far underneath the gate structure 10, which could cause transistor leakage problems.

The fabrication process of the device 5 typically includes the formation of oxide or nitride sidewall spacers 40, 42 on the sidewalls of the gate structure 10. Further processing may be performed as described in the '449 patent. Although the MOSFET memory array device 5 is a vast improvement over earlier memory array devices, it can still benefit from improved static refresh performance. Thus, it is still desirable to improve as much as possible the static refresh performance of the memory device.

SUMMARY OF THE INVENTION

The present invention provides a memory array device having improved static refresh over prior art memory array devices.

The above and other features and advantages of the invention are achieved by a double blanket ion implant method for forming diffusion regions in memory array devices, such as a MOSFET access device. The method provides a semiconductor substrate with a gate structure formed on its surface. Next, a first pair of diffusion regions are formed in a region adjacent to the channel region by a first blanket ion implantation process. The first blanket ion implantation process has a first energy level and dose. The device is subjected to oxidizing conditions, which form oxidized sidewalls on the gate structure. A second blanket ion implantation process is conducted at the same location as the first ion implantation process adding additional dopant to the diffusion regions. The second blanket ion implantation process has a second energy level and dose. The resultant diffusion regions provide the device with improved static refresh performance over prior art devices. In addition, the first and second energy levels and doses are substantially lower than an energy level and dose used in a prior art single implantation process.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF PREFERRED EMBODIMENTS

Figure 1:
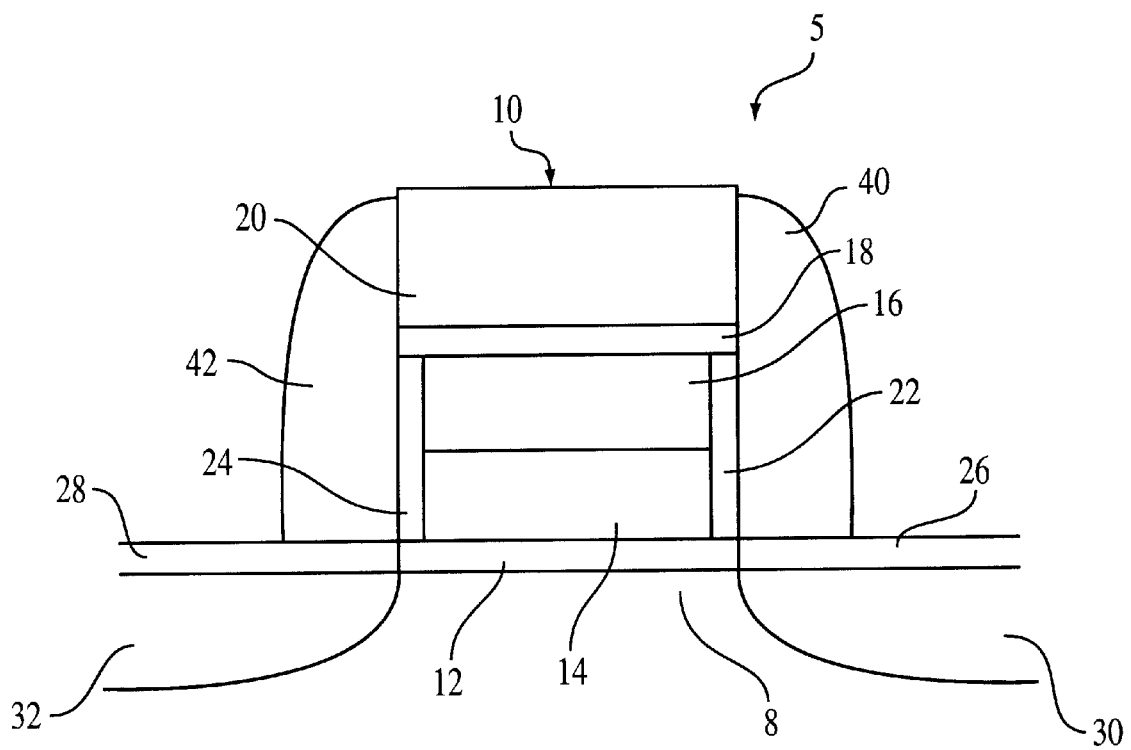
FIG. 1 is a fragmentary vertical cross-sectional view of a prior art memory array device conventional diffusion regions.

The present invention will be described as set forth in the preferred embodiments illustrated in FIGS. 2–7 and 11. Other embodiments may be utilized and structural or logical changes may be made without departing from the spirit or scope of the present invention. Like items are referred to by like reference numerals.

Figure 2:
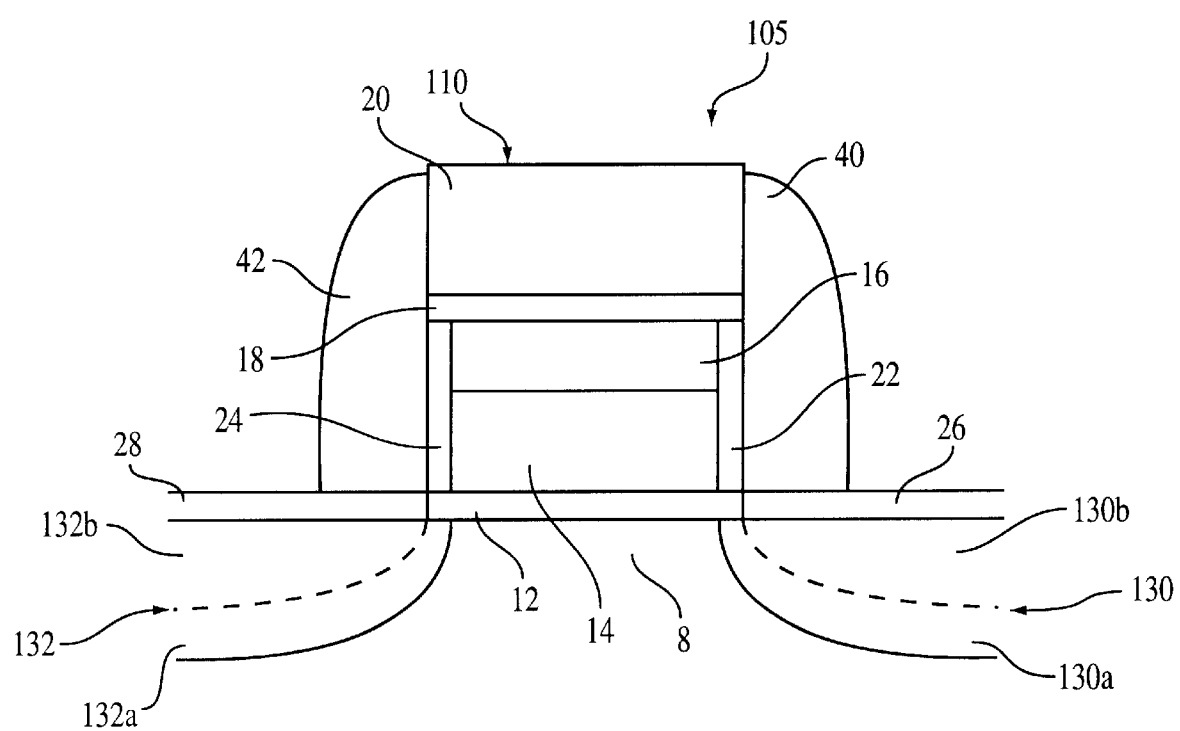
FIG. 2 is a fragmentary vertical cross sectional view of an integrated circuit memory array device formed in accordance with the present invention.

FIG. 2 illustrates a portion of an integrated circuit MOSFET memory array device 105 constructed in accordance with the present invention. The device 105 is preferably used as an access device of a DRAM memory cell. As will be described with reference to FIGS. 3 to 7, the device 105 including diffusion regions 130, 132 is fabricated using two blanket phosphorous ion implant steps sandwiched around a conventional re-ox step. Since two implant steps are performed, diffusion region 130 comprises two regions 130a, 130b having different dopant concentrations. Similarly, diffusion region 132 comprises two regions 132a, 132b having different dopant concentrations. As described with reference to FIGS. 9 and 10, the uniquely formed diffusion regions 130, 132 provide the device 105 with improved static refresh performance over the prior device 5 (illustrated in FIG. 1). Since the method uses two separate blanket phosphorous ion implant steps, it will be referred to hereinafter as a "double blanket ion implant method".

Hereinafter, the terms "wafer" and "substrate" are used interchangeably and are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation.

In addition, no particular order is required for the method steps described below, with the exception of those logically requiring the results of prior steps, for example formation of spacers 40, 42 adjacent to the sidewalls of the gate structure 10 logically requires the prior formation of the gate structure 10 and its sidewalls. Otherwise, enumerated steps are provided below in an exemplary order which may be altered, for instance the several ion implant steps may be rearranged using masking and etching steps as is known in the art.

Figure 3:
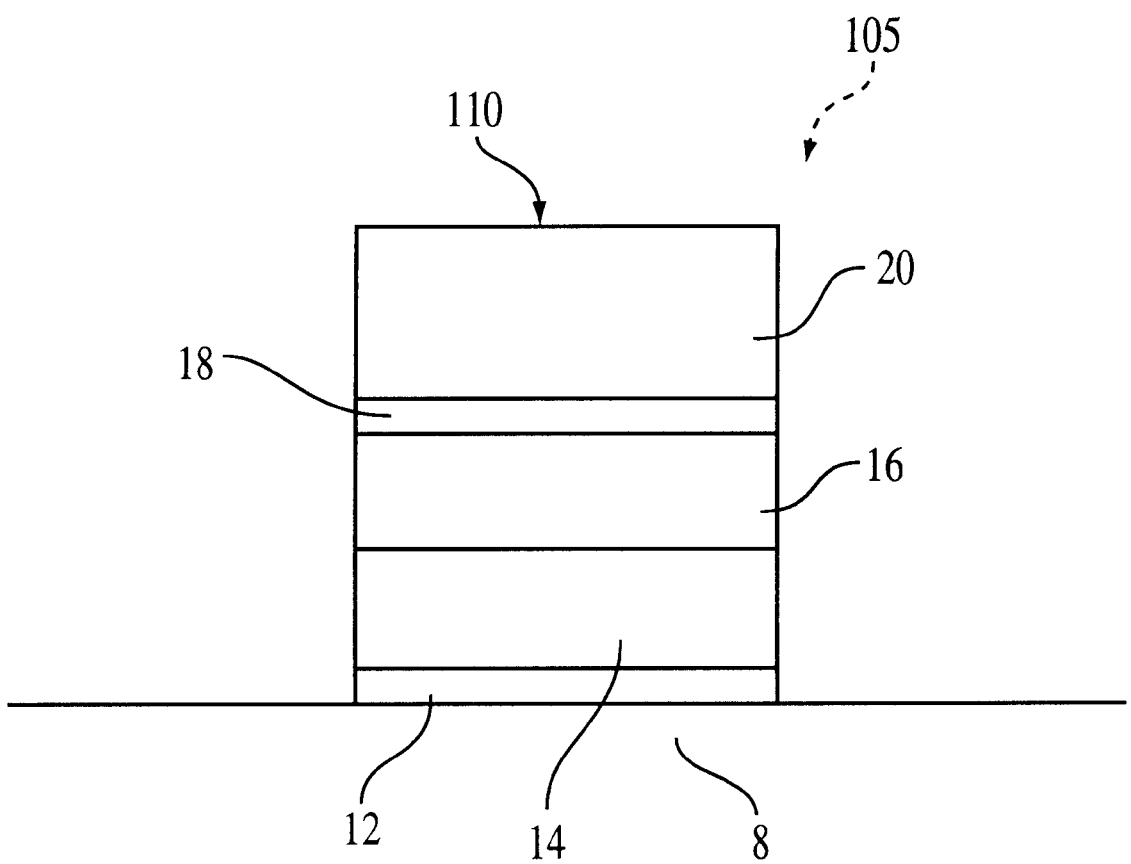
FIG. 3 is a fragmentary vertical cross sectional view of the device illustrated in FIG. 2 at an early stage of formation.

FIG. 3 shows the integrated circuit MOSFET memory array device 105 in accordance with the present invention at an early stage of formation. A gate structure 100 is provided on the substrate 8 as is known in the art and described in the '449 patent to Dennison et al. The substrate 8 is typically a bulk silicon substrate, which may have a doped well in which access transistors are to be formed. The gate structure 110 comprises a gate oxide 12, a conductive polysilicon layer 14, an overlying $WSi_x$ layer 16, an overlying oxide layer 18 and a $Si_3N_4$ capping layer 20. Unlike the gate structure 10 of the prior art device 5 illustrated in FIG. 1, the cross sectional length of the gate structure 110 may be substantially reduced. For example, the cross sectional length of the gate structure 110 can be substantially to approximately 0.20 microns. An advantage of the present invention is that the length of the gate structure 110 is reduced in comparison to the prior art due to the unique fabrication processing of the present invention (described below).

Figure 4:
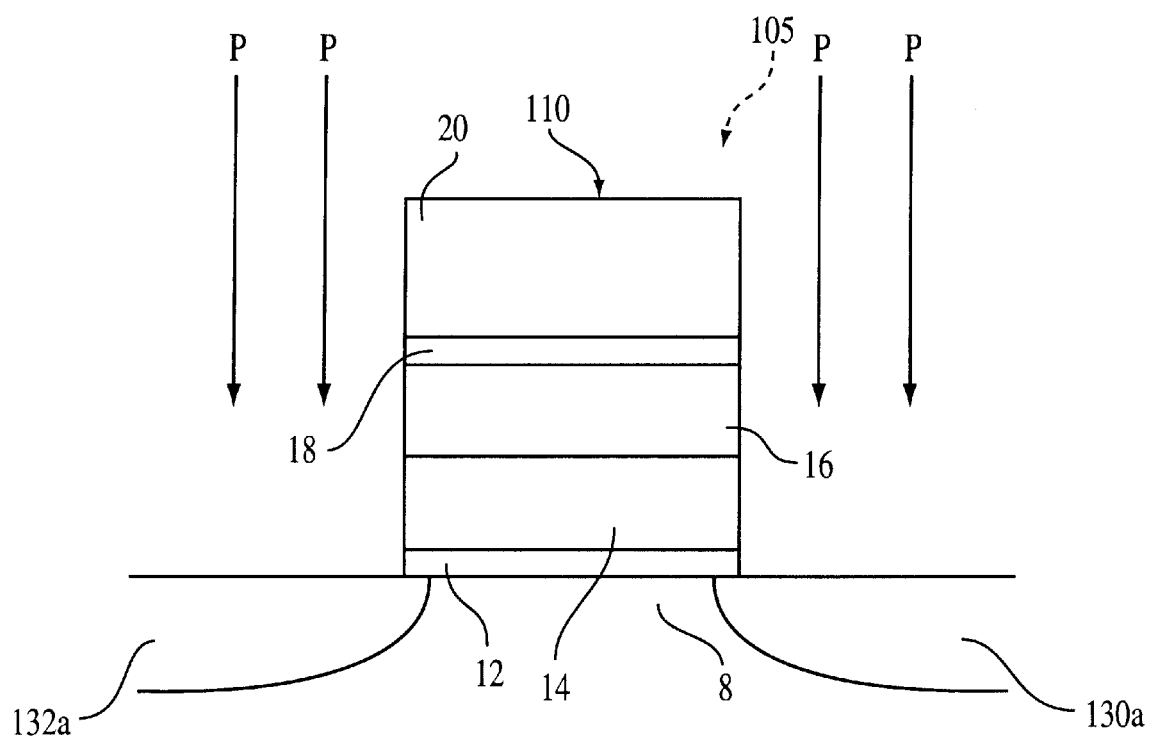
FIG. 4 is a fragmentary vertical cross sectional view of the device illustrated in FIG. 3 at a later stage of formation.

Referring now to FIG. 4, diffusion regions 130a, 132a are formed in the substrate 8 adjacent the sidewalls of the gate structure 110 and extend laterally away from the gate structure 110. It should be noted that a portion of the diffusion regions 130a, 132a diffuse beneath the gate structure 110. To create the diffusion regions 130a, 132a, the substrate 8 undergoes a first blanket implant step. It is desirable that an n-type be used, which makes the device 105 an NMOS device. It is desirable that the n-type dopant be phosphorous. However, it should be noted that other dopants can be used if so desired. For example, other n-type dopants such as arsenic or antimony could be used. If it were desirable for the device 105 to be a PMOS device, a p-type dopant such as boron, boron bifluoride ($BF_2$) or borane ($B_2H_{10}$,) could be used. This first blanket phosphorous implant may be performed, for example, at an energy level of approximately 15 Kev with a dose of approximately $2\times10^{12}$ ions/cm$^2$. It should be appreciated that any other suitable dose and energy level can be used for this step. One exemplary range for the first blanket phosphorous implant may include an energy level between approximately 5 Kev to 45 Kev with a dose of approximately $1\times10^{12}$ ions/cm$^2$ to slightly less than $7\times10^{12}$ ions/cm$^2$.

It must be noted that this blanket phosphorous implant step is performed prior to a subsequent re-ox step since the energy level and dose is substantially lower than the dose used in the prior art (i.e., energy level ranging from 30 Kev to 60 Kev with a dose ranging from $7\times10^{12}$ ions/cm$^2$ to $1.5\times10^{13}$ ions/cm$^2$ to provide an average dopant concentration for the diffusion regions 30, 32 ranging from $1\times10^{17}$ ions/cm$^3$ to $1\times10^{19}$ ions/cm$^3$). Thus, the first blanket phosphorous implant step can be performed prior to the re-ox step without having the phosphorous diffuse too far underneath the gate structure 110 and without causing subsequent transistor leakage problems.

Figure 5:
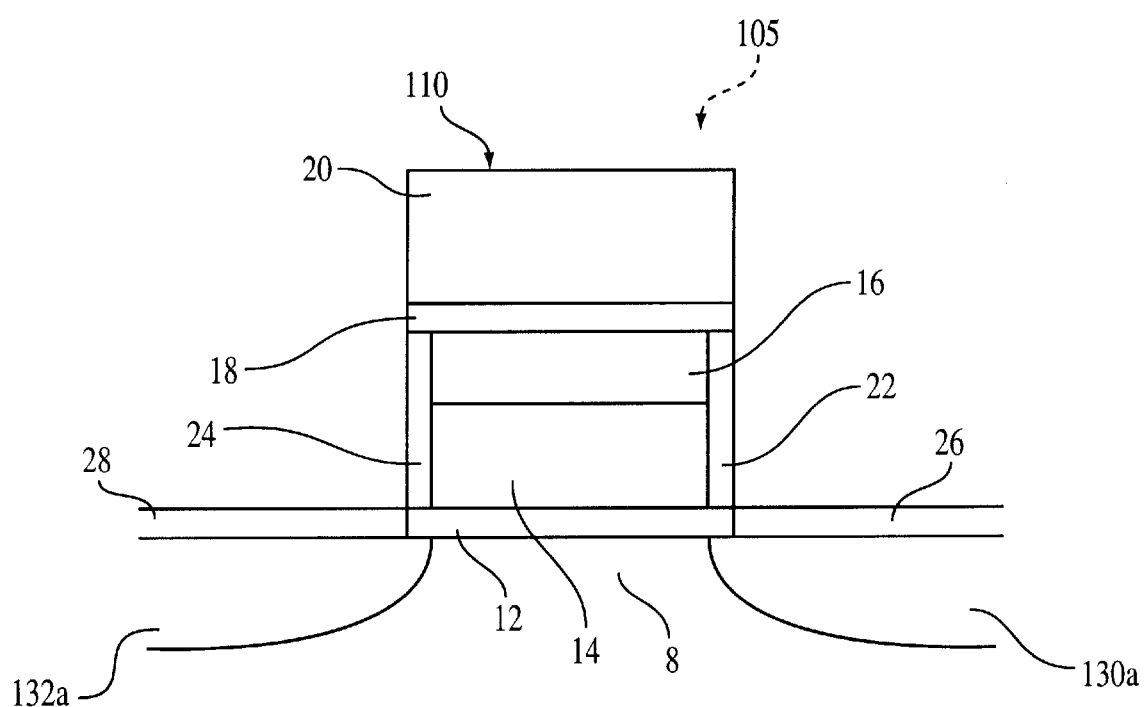
FIG. 5 is a fragmentary vertical cross sectional view of the device illustrated in FIG. 4 at a later stage of formation.
Figure 6:
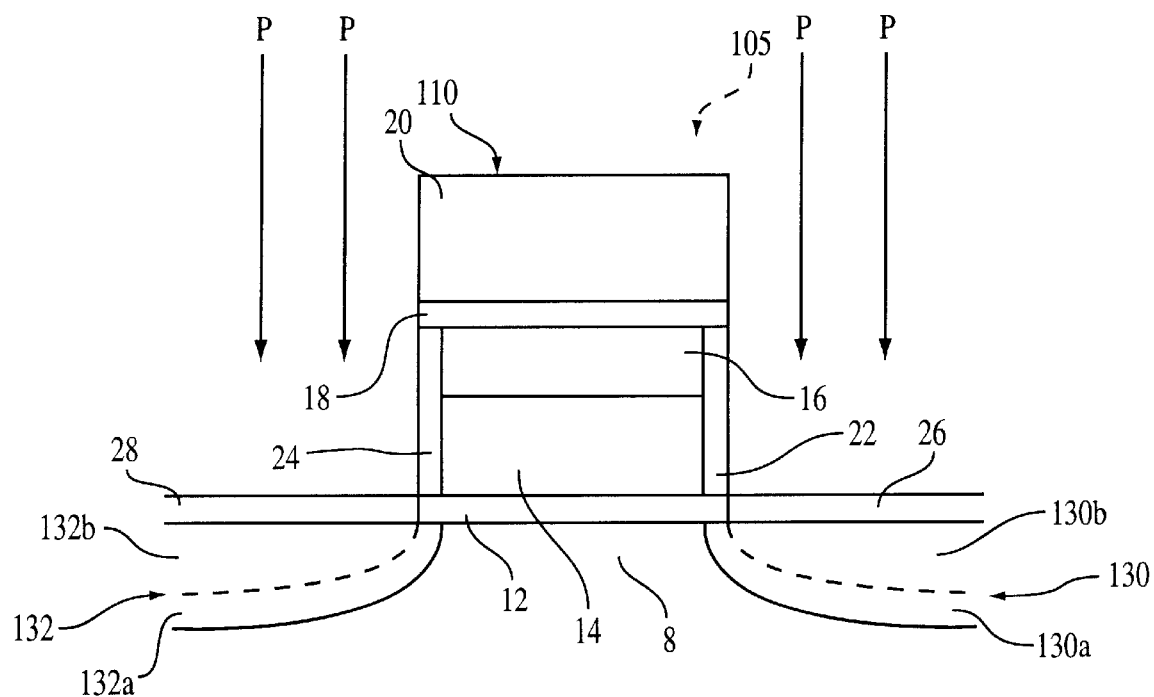
FIG. 6 is a fragmentary vertical cross sectional view of the device illustrated in FIG. 5 at a later stage of formation.

Referring now to FIG. 5, a re-ox step is performed forming oxidized sidewalls 22, 24 on the gate structure 110 and oxide regions 26, 28 on the substrate 8. It should be appreciated that any conventional re-ox process can be performed at this point, such as a thermal re-ox process or a source/drain thermal re-ox process. Referring to FIG. 6, diffusion regions 130b, 132b are formed in the substrate 8 at the same location as diffusion regions 130a, 132b. To create the second diffusion regions 130b, 132b, the substrate 8 undergoes a second blanket implant step. As with the first blanket implant step, it is desirable that the dopant used is phosphorous. However, it should be noted that other dopants can be used if so desired, particularly if a different conductivity type of the device 105 is desired. This second blanket phosphorous implant may be performed at an energy level of approximately 20 Kev with a dose of approximately $4 \times 10^{12}$ ions/cm$^2$. It should be appreciated that any other suitable dose and energy level can be used for this step. One exemplary range for the second blanket phosphorous implant may include an energy level between approximately 5 Kev to 60 Kev with a dose of approximately $1 \times 10^{12}$ ions/cm$^2$ to $1 \times 10^{13}$ ions/cm$^2$.

The oxidized sidewalls 22, 24 on the gate structure 110 prevent the second implant from diffusing underneath the gate structure 110, which helps in the formation of the individual diffusion regions 130a, 130b, 132a, 132b. The two diffusion regions 130a, 130b combine to form one diffusion region 130. The resultant diffusion region 130 will have two different dopant concentrations, one from region 130a and one from region 130b. There will be a smooth transition between the dopant concentrations of the two regions 130a, 130b. Similarly, the two diffusion regions 132a, 132b combine to form one diffusion region 132. The resultant diffusion region 132 will have two different dopant concentrations, one from region 132a and one from region 132b. There will be a smooth transition between the dopant concentrations of the two regions 132a, 132b. As will be discussed below, these uniquely formed diffusion regions 130, 132 allow the device 105 to have substantially better static refresh performance in comparison to the prior art device 5 (FIG. 1).

Figure 7:
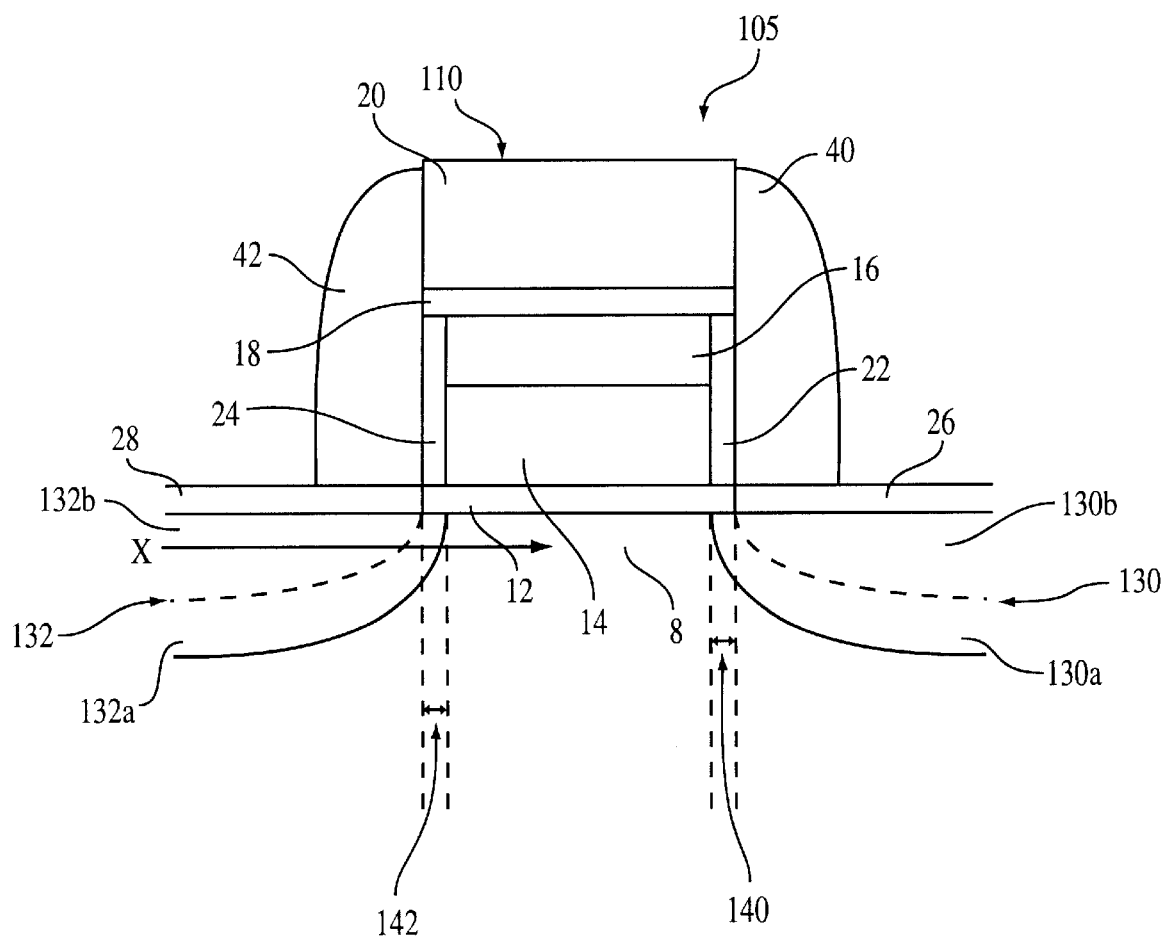
FIG. 7 is a fragmentary vertical cross sectional view of the device illustrated in FIG. 6 at a later stage of formation.

Referring to FIG. 7, oxide or nitride sidewall spacers 40, 42 may be formed on the on the sidewalls of the gate structure 110 (as described in the '449 patent or by any other known method). In addition, further processing may be performed to form a memory cell as described in the '449 patent. It can be seen that the device 105 has two diffusion regions 130, 132, each having a pair of diffusion regions 130a, 130b, 132a, 132b, respectively.

Figure 8:
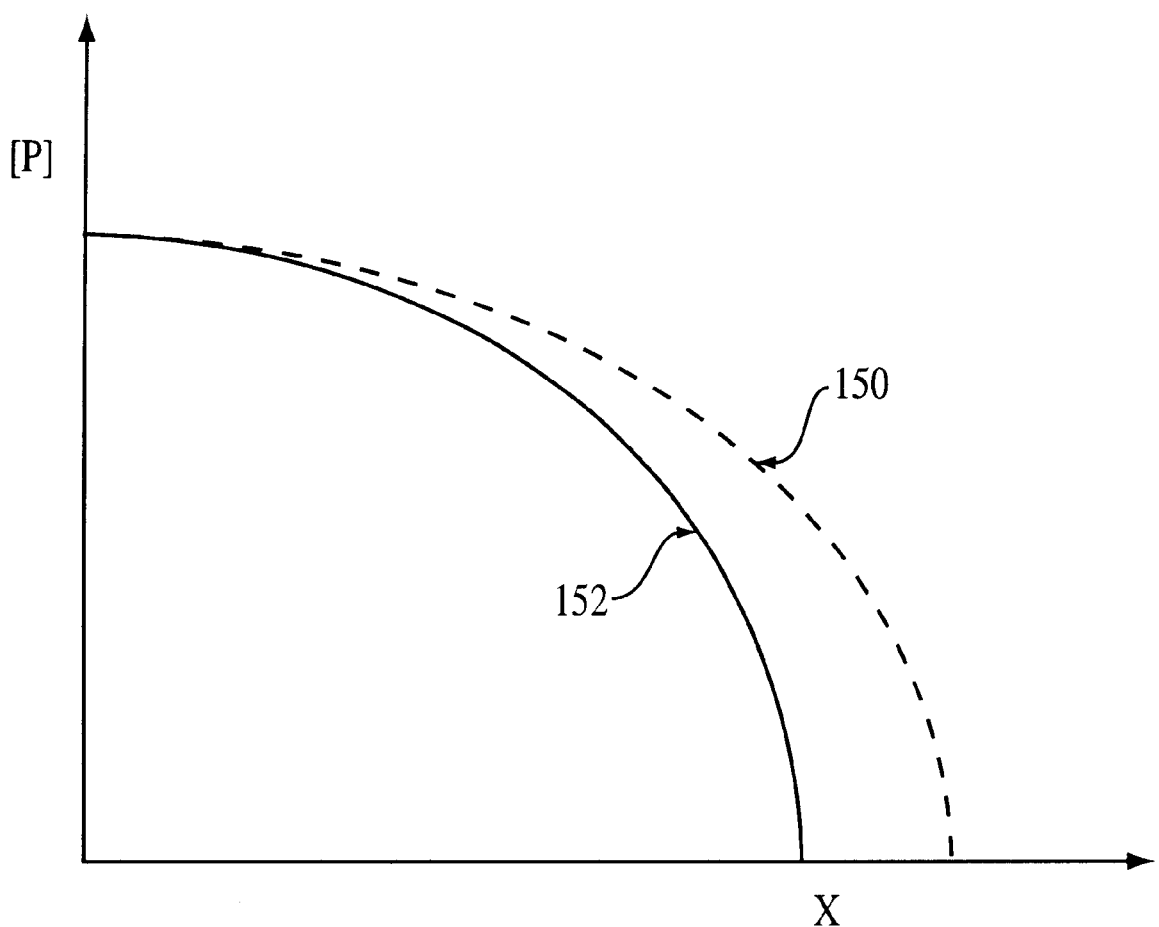
FIG. 8 is a graph illustrating the dopant concentration of diffusion regions within the devices illustrated in FIGS. 1 and 2.

FIG. 8 illustrates an exemplary phosphorous concentration 150 of the second diffusion region 132 with respect to its length (illustrated by arrow X). It should be noted that the first diffusion region 130 would have a similar concentration, but in a direction opposite the direction indicated by arrow X. An exemplary phosphorous concentration 152 of the prior art device is also illustrated. From the curves 150, 152 it can be seen how the second diffusion region 132 has a more graded concentration of phosphorous than the prior art diffusion regions (e.g., region 32 in FIG. 1). By more graded, we mean that the net doping concentration versus distance changes gradually. By contrast, as shown by curve 152, the diffusion region 32 (FIG. 1) of the prior art device has an abrupt change in concentration of phosphorous versus distance. That is, the net doping concentration of the prior art curve 152 undergoes a steep change with respect to distance. With a graded dopant concentration of the diffusion regions, the resistance to current flow is less than the diffusion regions of the prior art. Although the invention is not to be bound to any specific theory, it is believed that the more graded concentration of the present invention improves the static refresh of the device 105 by improving the junction at the storage node of the DRAM memory cell.

Referring again to FIG. 7, it can be seen that the two diffusion regions 130, 132 slightly diffuse below the gate structure 110. That is, there is a first region 140 of the first diffusion region 130 that resides underneath a portion of the gate structure 110. Similarly, there is a second region 142 of the second diffusion region 132 that resides underneath a portion of the gate structure 110. These regions 140, 142, which can be referred to as "overlap" regions, make the device 105 more robust to reliability stressing. That is, the overlap regions 140, 142 are less likely to degrade when high voltage is applied to the device, such as the types of voltages applied during manufacturing stress testing. These regions 140, 142, which are not present in the prior art device 5 (FIG. 1), are formed by the first blanket phosphorous implant step (FIG. 4). That is, by having the first blanket phosphorous implant step (FIG. 4) prior to the re-ox step (FIG. 5) some dopant can diffuse underneath the gate structure 110 forming region 140, 142 and causing the device 105 to have the above-mentioned robustness. This is another benefit of the present invention.

A standard measure of refresh performance is known as a "time to unrepairable calculation". The term "repair" is sometimes used to indicate that a memory cell or memory bit has been repaired by electrical replacement with a redundant element. The terms "un repaired" or "un-repairable" are often used to indicate that the number of failing bits exceeds the capability of repair by redundant elements. In the time to un-repairable test, data is written into the bits of memory cells in the DRAM array. Measurements are taken to determine when a predetermined number of bits have lost their charge and within what time. The time it takes for the bits to lose their charge is commonly referred to as the "time to un-repairable" (TTUR).

Figure 9:
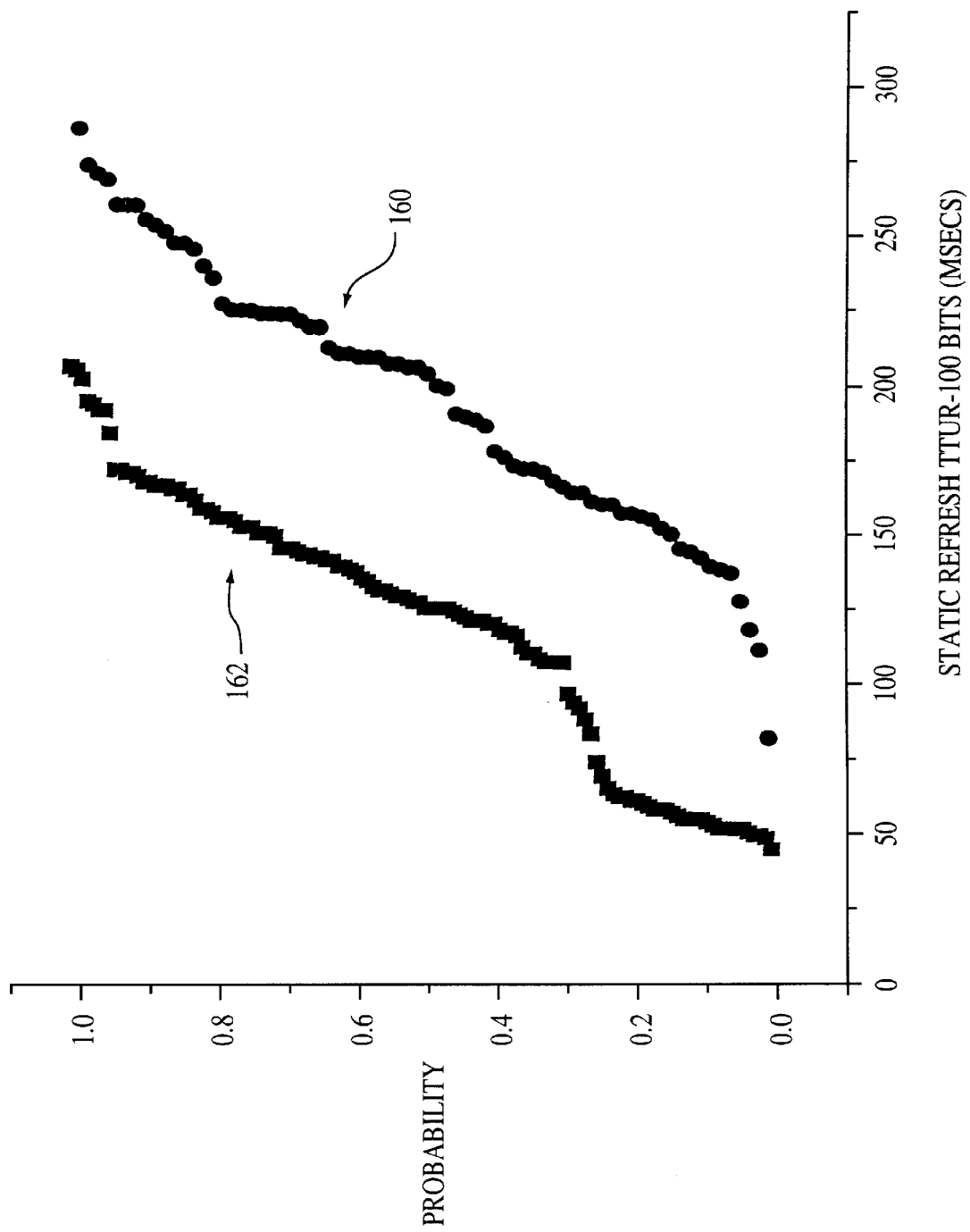
FIGS. 9 and 10 are graphs illustrating the static refresh performance of the devices illustrated in FIGS. 1 and 2.

Referring now to FIGS. 1, 2 and 9. The inventors ran experiments to compare TTUR results using the prior art device 5 (FIG. 1) with the results using the device 105 (FIG. 2) constructed in accordance with the present invention. FIG. 9 illustrates results from TTUR tests based on finding 100 bits that have lost their charge. The y-axis indicates the probability that 100 bits have lost their charge. The x-axis indicates the time when the charge was lost (and when a refresh operation became necessary). The first set of data 160 illustrates the results using the device 105 of the present invention. The second set of data 162 illustrates the results using the device 5 of the prior art. From the data 160, 162, it can be seen that 100 bits lost their charge (with 50% probability, i.e., 0.5 on the y-axis) using the prior art device 5 at approximately 120 milliseconds, while 100 bits lost their charge using the device 105 at approximately 210 milliseconds. That is, there is almost a 90 millisecond improvement in the device 105 constructed in accordance with the present invention. It is believed that this improvement is due to the uniquely formed diffusion regions 130, 132 of the device 105.

Figure 10:
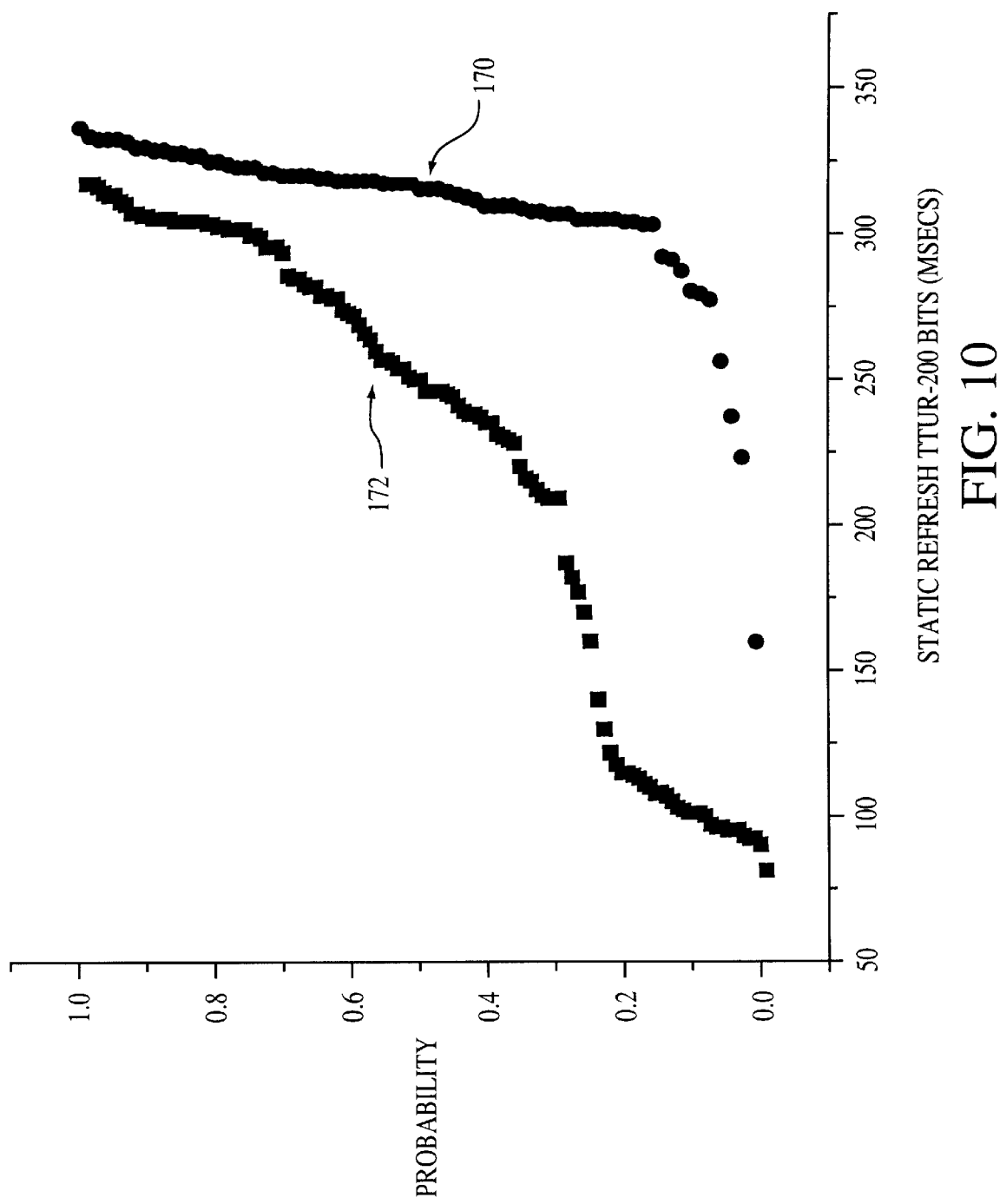

Referring now to FIGS. 1, 2 and 10. FIG. 10 illustrates results from TTUR tests based on finding 200 bits that have lost their charge. The y-axis indicates the probability that 200 bits have lost their charge. The x-axis indicates the time when the charge was lost (and when a refresh operation became necessary). The first set of data 170 illustrates the results using the device 105 while the second set of data 172 illustrates the results using the device 5. From the data 170, 172, it can be seen that 200 bits lost their charge (with 50% probability, i.e., 0.5 on the y-axis) using the prior art device at approximately 240 milliseconds, while 200 bits lost their charge using the device 105 at approximately 310 milliseconds. That is, there is almost a 70 millisecond improvement.

Figure 11:
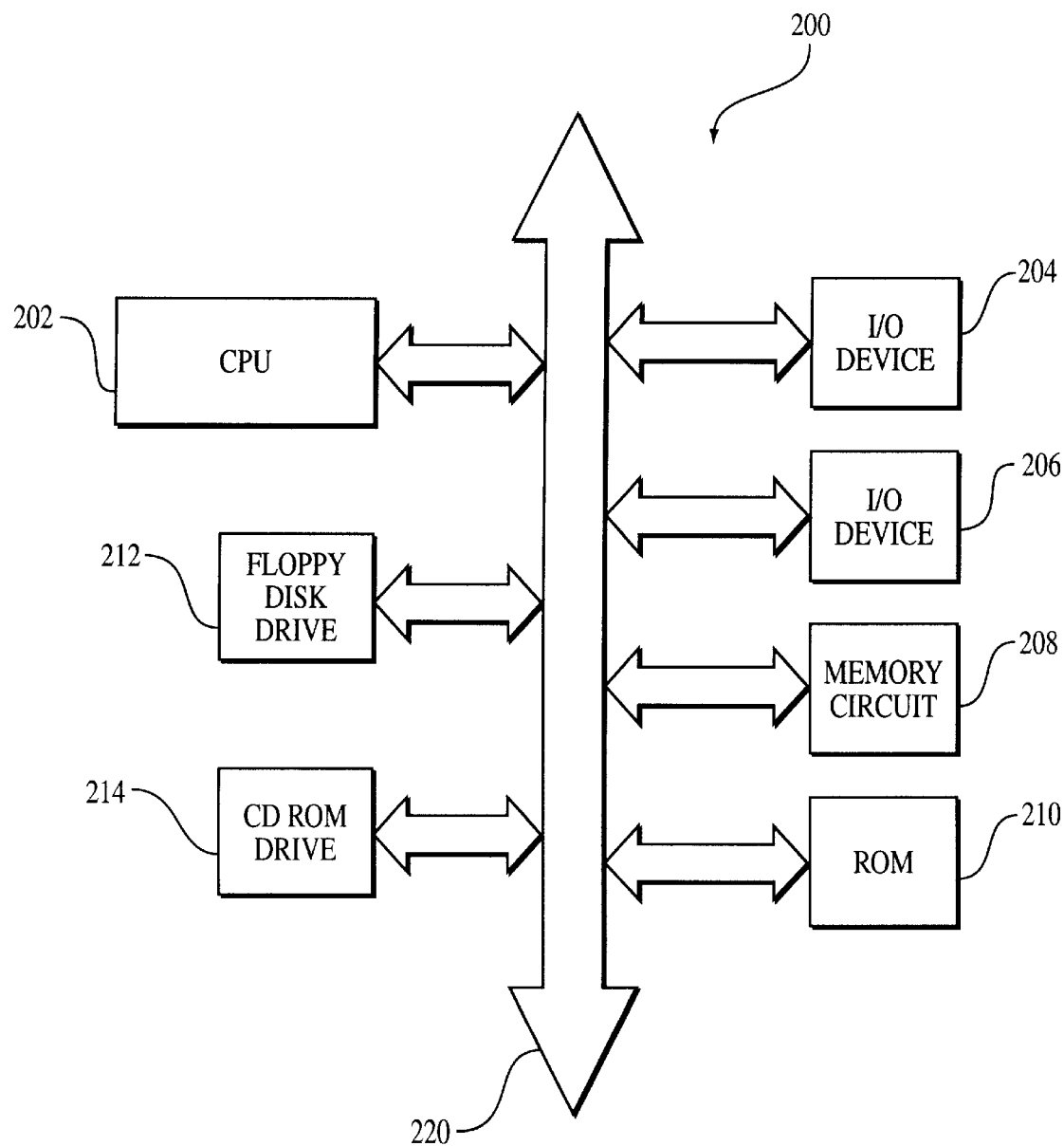
FIG. 11 is block diagram of a processor-based system including a memory device formed in accordance with the present invention.

FIG. 11 illustrates a block diagram of a processor based system 200 utilizing a DRAM memory circuit 208 constructed in accordance with the present invention. That is, the memory circuit 208 utilizes the MOSFET memory array device 105 (FIG. 2) constructed in accordance with the present invention (FIGS. 3 to 7). The processor-based system 200 may be a computer system, a process control system or any other system employing a processor and associated memory. The system 200 includes a central processing unit (CPU) 202, e.g., a microprocessor, that communicates with the DRAM memory circuit 208 and an I/O device 204 over a bus 220. It must be noted that the bus 220 may be a series of buses and bridges commonly used in a processor-based system, but for convenience purposes only, the bus 220 has been illustrated as a single bus. A second I/O device 206 is illustrated, but is not necessary to practice the invention. The processor-based system 200 also includes a read-only memory (ROM) circuit 210 and may include peripheral devices such as a floppy disk drive 212 and a compact disk (CD) ROM drive 214 that also communicates with the CPU 202 over the bus 220 as is well known in the art. It should be noted that the CPU 202 can be combined on a single chip with one or more DRAM memory circuits 208 and ROM circuits 210.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. An integrated circuit semiconductor device comprising:

a substrate having a first surface;

a gate structure formed on said first surface; and first and second diffusion regions formed within said substrate on opposite sides of said gate structure, wherein each of said diffusion regions comprise first and second portions respectively having first and second dopant concentrations, which are different and cause each diffusion region to have a graded dopant concentration;

wherein said first diffusion region is partially located underneath a thermally re-oxidized first side wall of said gate structure and said second diffusion region is partially located underneath a thermally re-oxidized second side wall of said gate structure.

2. The device of claim 1 wherein said first and second diffusion regions are doped with phosphorous.

3. A processor-based system comprising:

a processor, and an integrated circuit semiconductor device coupled to said processor, said integrated circuit semiconductor device comprising:

a substrate having a first surface;

a gate structure formed on said first surface; and first and second diffusion regions formed within said substrate on opposite sides of said gate structure, wherein each of said diffusion regions comprise first and second portions respectively having first and second dopant concentrations, which are different and cause each diffusion region to have a graded dopant concentration.

4. A processor-based system comprising:

a processor; and an integrated circuit semiconductor device coupled to said processor, said integrated circuit semiconductor device being integrated on a same chip as said processor, said integrated circuit semiconductor device comprising:

a substrate having a first surface;

a gate structure formed on said first surface; and first and second diffusion regions formed within said substrate on opposite sides of said gate structure, wherein each of said diffusion regions comprise first and second portions respectively having first and second dopant concentrations, which are different and cause each diffusion region to have a graded dopant concentration.

\* \* \* \* \*

UNITED STATES PATENT AND TRADEMARK OFFICE
CERTIFICATE OF CORRECTION

PATENT NO. : 6,410,951 B2
DATED : June 25, 2002
INVENTOR(S) : Kunal R. Parekh et al.

It is certified that error appears in the above-identified patent and that said Letters Patent is hereby corrected as shown below:

<u>Column 4,</u>
Line 21, replace "substantially to" with -- substantially reduced to --

<u>Column 5,</u>
Line 36, replace "on the on the" with -- on the --

Signed and Sealed this

Nineteenth Day of November, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

PATENT NO. : 6,410,951 B1
DATED : June 25, 2002
INVENTOR(S) : Mark Fischer et al.

It is certified that error appears in the above-identified patent and that said Letters Patent is hereby corrected as shown below:

<u>Title page,</u>
Item [75], Inventors, "Kunal R. Parekh et al.", should read -- Mark Fischer et al. -- on the Certificate of Correction published November 19, 2002.

Signed and Sealed this

Eighth Day of November, 2005

JON W. DUDAS
*Director of the United States Patent and Trademark Office*